United States Patent
Lee et al.

(10) Patent No.: US 8,575,746 B2
(45) Date of Patent: Nov. 5, 2013

(54) CHIP ON FLEXIBLE PRINTED CIRCUIT TYPE SEMICONDUCTOR PACKAGE

(75) Inventors: Si-Hoon Lee, Yongin-si (KR); Sa-Yoon Kang, Seoul (KR); Kyoung-Sei Choi, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 937 days.

(21) Appl. No.: 11/878,016

(22) Filed: Jul. 20, 2007

(65) Prior Publication Data
US 2008/0023822 A1    Jan. 31, 2008

(30) Foreign Application Priority Data

Jul. 20, 2006   (KR) .................. 10-2006-0068173
Nov. 6, 2006   (KR) .................. 10-2006-0108910

(51) Int. Cl.
*H01L 23/14*    (2006.01)
*H01L 23/34*    (2006.01)

(52) U.S. Cl.
USPC ........... 257/702; 257/578; 257/690; 257/712; 257/675; 257/668; 257/669; 257/E23.005; 257/713; 257/707

(58) Field of Classification Search
USPC ......... 257/678, 690, 712, 675, 702, 668, 669, 257/E23.005
See application file for complete search history.

(56) References Cited

U.S. PATENT DOCUMENTS

| | | | | |
|---|---|---|---|---|
| 5,134,462 A | * | 7/1992 | Freyman et al. | 257/688 |
| 5,907,903 A | * | 6/1999 | Ameen et al. | 29/830 |
| 6,134,776 A | * | 10/2000 | Hoffmeyer | 29/840 |
| 6,175,151 B1 | * | 1/2001 | Hashimoto | 257/676 |
| 6,300,168 B1 | * | 10/2001 | Takeuchi | 438/122 |
| 6,765,254 B1 | | 7/2004 | Hui et al. | |
| 6,774,432 B1 | | 8/2004 | Ngo et al. | |
| 6,861,750 B2 | * | 3/2005 | Zhao et al. | 257/739 |
| 6,894,904 B2 | | 5/2005 | Kung et al. | |
| 7,259,448 B2 | | 8/2007 | Zhang et al. | |
| 2005/0230818 A1 | * | 10/2005 | Ohno et al. | 257/707 |
| 2008/0258290 A1 | | 10/2008 | Nakajima | |

FOREIGN PATENT DOCUMENTS

| | | |
|---|---|---|
| JP | 09-066620 | 3/1997 |
| JP | 1999-145321 | 5/1999 |
| JP | 11-176887 | 7/1999 |
| JP | 2003-092011 | 3/2003 |
| JP | 2005-108387 | 4/2005 |
| JP | 2005-327940 | 11/2005 |

(Continued)

OTHER PUBLICATIONS

Preliminary Notice of First Office Action, Taiwan Patent Office, Mar. 26, 2013.

(Continued)

*Primary Examiner* — Junghwa M Im
(74) *Attorney, Agent, or Firm* — Muir Patent Consulting, PLLC

(57) ABSTRACT

A Chip on Flexible Printed Circuit (COF) type semiconductor package may include a flexible film, a semiconductor IC chip on the flexible film, and a heating pad on the flexible film.

34 Claims, 5 Drawing Sheets

(56) References Cited

FOREIGN PATENT DOCUMENTS

| | | |
|---|---|---|
| JP | 2006-064939 | 3/2006 |
| JP | 2006-108356 | 4/2006 |
| KR | 1020040004942 A | 1/2004 |
| KR | 10-2007-0056499 A | 6/2007 |
| KR | 10-2008-0011802 A | 2/2008 |
| TW | 439234 | 6/2001 |
| TW | 439236 | 6/2001 |
| TW | 200423348 | 11/2004 |
| TW | M263622 | 5/2005 |
| TW | 200610127 | 3/2006 |

OTHER PUBLICATIONS

Jul. 19, 2013 Official Notice from Japanese Patent Office in connection with related JP Application No. 2007-189597.

\* cited by examiner

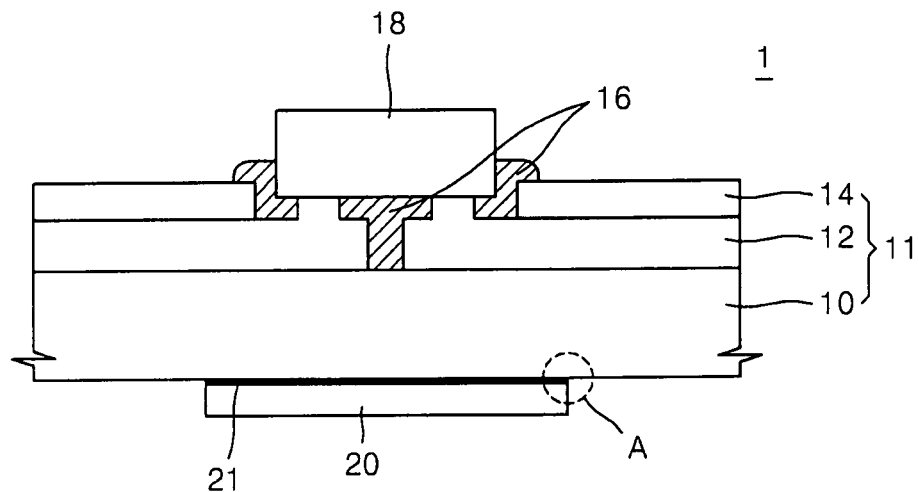
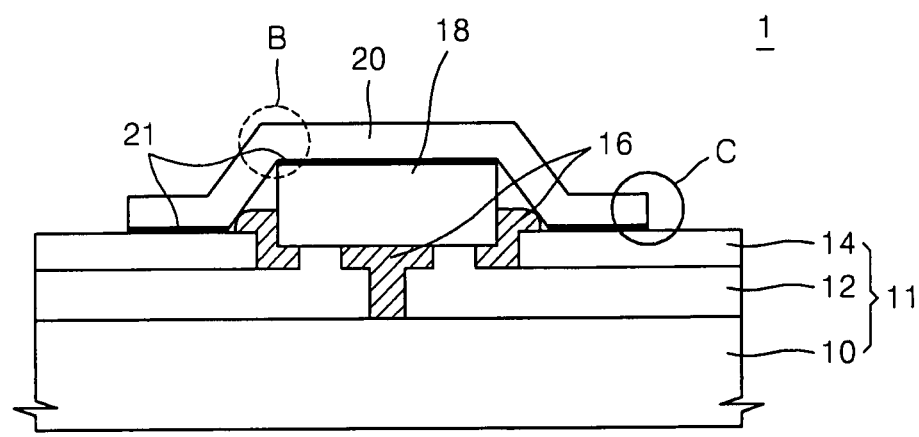
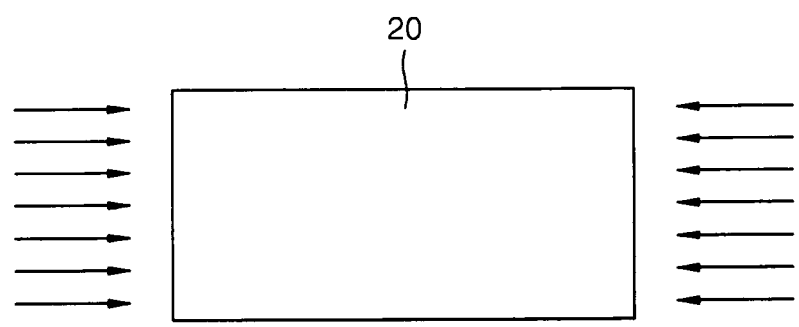

ized integrated circuit (IC)
CHIP ON FLEXIBLE PRINTED CIRCUIT TYPE SEMICONDUCTOR PACKAGE

PRIORITY STATEMENT

A claim of priority is made to Korean Patent Application Nos. 2006-68173, filed on Jul. 20, 2006 and 2006-108910, filed on Nov. 6, 2006, in the Korean Intellectual Property Office, the disclosures of which are incorporated herein in their entirety by reference.

BACKGROUND

1. Field

Example embodiments may relate to a semiconductor package, and more particularly to a Chip On Flexible Printed Circuit type semiconductor package.

2. Description of the Related Art

As higher operating scale downed integrated circuit (IC) drivers configured to drive Liquid Crystal Display (LCD) panels may be needed, a variety of semiconductor packages have been developed. In general, Tape Carrier Package (TCP), Chip On Glass (COG), and Chip On Flexible Printed Circuit (COF) may be semiconductor type packages used to drive the LCD panels. Since the 1980's, the TCP type semiconductor package has been used to drive high resolution monitors. The TCP type semiconductor package has been one of the favored semiconductor packages used in the LCD field. However, the TCP type semiconductor package may have higher costs associated with production and/or the productivity of the TCP type semiconductor package may not be as high.

Accordingly, the TCP type semiconductor package has been replaced with the COF type semiconductor as the package of choice, and applications for the COF type semiconductor package have increased in the LCD field. The COF type semiconductor package has been introduced as LCD IC drivers to correspond with scale downed and/or higher operating speed IC drivers.

Recently, to realize higher resolution display devices, for example, LCD panels, a driving load of the IC driver may be increased as driving frequency of TVs and monitors have increased from 60 Hz to 120 Hz.

SUMMARY

In an example embodiment, a Chip on Flexible Printed Circuit (COF) type semiconductor package may include a flexible film, a semiconductor IC chip on the flexible film, and a heating pad on the flexible film.

In another example embodiment, a Chip on Flexible Printed Circuit (COF) type semiconductor package may include a flexible film, a semiconductor IC chip on the flexible film, and a heating pad on the semiconductor IC chip and the flexible film, the heating pad including slots corresponding to corner edges of the semiconductor IC chip.

In an example embodiment, a Chip on Flexible Printed Circuit (COF) type semiconductor package may include a flexible film, a semiconductor IC chip on the flexible film, and a heating pad including slots on the flexible film.

In example embodiments, a COF type semiconductor package may regulate or dissipate excess heat.

BRIEF DESCRIPTION OF THE DRAWINGS

The above and other features of example embodiments may become more apparent with the detail descriptions thereof with reference to the attached drawings in which:

FIG. 1 is a cross sectional view of a COF type semiconductor package having a heating pad according to an example embodiment;

FIG. 2 is a cross sectional view of a COF type semiconductor package having a heating pad according to another example embodiment;

FIGS. 3 through 5 are schematic drawings of heating pads according to example embodiments;

DETAILED DESCRIPTION OF EXAMPLE EMBODIMENTS

Figure 4:
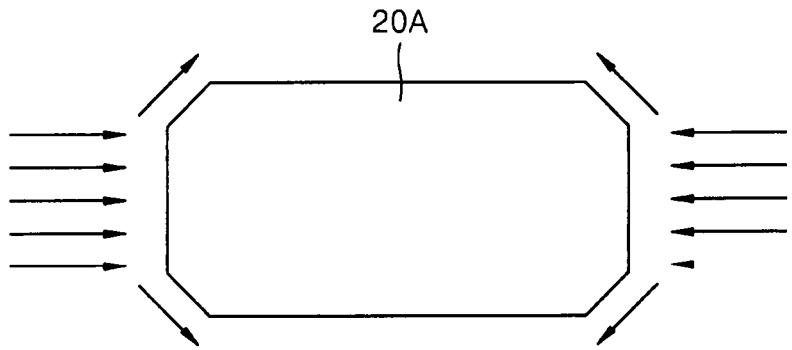

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items. It will be understood that when an element or layer is referred to as being "on", "connected to" or "coupled to", "directly on," "directly connected to" or "directly coupled to" another element or layer, it may be above, below, or to the side of the element or layer.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 may be a cross sectional view of a Chip On Flexible Printed Circuit (COF) type semiconductor package 1 having a heating pad 20 according an example embodiment. Referring to FIG. 1, a COF type semiconductor package 1 may include a semiconductor IC chip 18 disposed on a flexible film 11. The flexible film 11 may include a lower insulation layer 10, a lead layer 12, and/or a surface insulation layer 14. For example, the lower insulation layer 10 may be of polyimide, the lead layer 12 may be of copper, and the surface insulation layer 14 may be a surface resist layer. Horizontally, a plurality of lead layers 12 may be disposed on the lower insulation 10 separately from each other and inner ends of the lead layers 12 may be disposed to be concentrated in a central region. The surface insulation layer 14 may cover the lead layers 12 and expose the inner ends of the lead layers 12.

In areas between the semiconductor IC chip 18 and the flexible film 11, an under fill 16 may be provided to secure the semiconductor IC chip 18 and the flexible film 11.

A heating pad 20 may be attached to the lower insulation layer 10 of the flexible film 11 by an adhesive layer 21 including conductive materials, for example, acrylic-based adhesive layer. The heating pad 20 may radiate heat generated from the semiconductor IC chip 18, after the heat passes through the under fill 16, the lead layer 12, and/or the lower insulation layer 10. In example embodiments, a conductivity of the heating pad 20 is higher than a conductivity of the lower insulation layer 10. For example, the heating pad 20 may be made of a metal material, for example, aluminum, etc. To improve protection against heat, the adhesive layer 21 may be disposed between the heating pad 20 and the lower insulation layer 10. The adhesive layer 21 may include conductive materials, for example, metal particles and/or metal balls. The adhesive layer 21 may include aluminum particles or balls.

Referring to FIGS. 1 and 3, the shape of the heating pad 20 may be rectangular. During the manufacturing process of the COF type semiconductor package 1, a plurality of semiconductor IC chips 18 may be disposed on a single extended flexible film. Prior to cutting each individual COF type semiconductor package 1 from the extended flexible film, the entire flexible film may be transported to an apparatus adapted to cutting the individual COF type semiconductor package 1. However, it may not be possible to transport the flexible film in the extended state. In other words, it may be necessary to wind the flexible film like a reel of film. Once the wounded flexible film is transported to the appropriate apparatus, the flexible film may be unwound, and then the individual COF type semiconductor package 1 may be cut away from the flexible film. However, as illustrated by the arrows in FIG. 3, when the flexible film is wound and unwound repeatedly, stress may be concentrated on the peripheral edges of the heating pad 20 as indicated by "A" in FIG. 1. The stress may cause the corners of the heating pad 20 to detach from the flexible film.

In an example embodiment as illustrated in FIG. 4, corners of a heating pad 20A may be tapered or chamfered. For example, the corners may be a chamfer cut. With the corners tapered, stress that may be pressed against the corners of the heating pad 20A may be substantially reduced. As can be seen from FIG. 4, the stress as illustrated by the arrows may be reduced by the chamfered corners. Therefore, even if a flexible film 11 is wound prior to being transported to a cutting apparatus, the heating pads 20A may remain attached to a lower insulation layer 10 of the flexible film 11.

Figure 5:
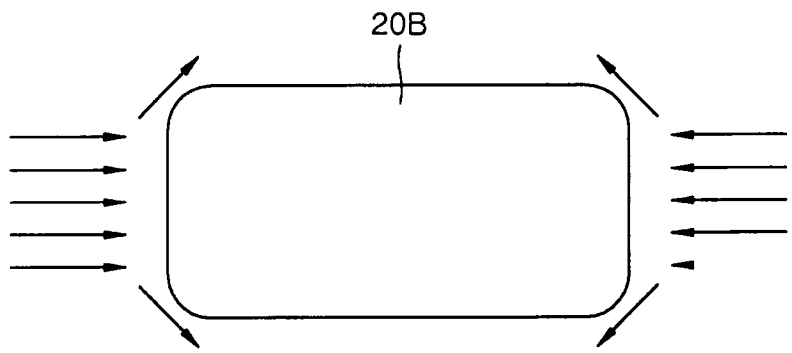

In another example embodiment as illustrated in FIG. 5, corners of a heating pad 20B may be tapered, but instead of a chamfer cut, the corners may be rounded. Accordingly, as can be seen from FIG. 5, the stress as illustrated by the arrows may be reduced by the rounded corners. Therefore, even if a flexible film 11 is wound to be transported to a cutting apparatus, the heating pads 20B may remain attached to a lower insulation layer 10 of the flexible film 11.

FIG. 2 is a cross sectional view of a COF type semiconductor package 1 having a heating pad 20 according to another example embodiment. Referring to FIG. 2, a COF type semiconductor package 1 may include a semiconductor IC chip 18 disposed on a flexible film 11. The flexible film 11 may include a lower insulation layer 10, a lead layer 12, and/or a surface insulation layer 14. For example, the lower insulation layer 10 may be of polyimide, the lead layer 12 may be of copper, and the surface insulation layer 14 may be a surface resist layer. The semiconductor IC chip 18 may be attached on the exposed part of the lead layer 10. In areas around the semiconductor IC chip 18, an under fill 16 may be provided to secure the semiconductor IC chip 18 and the flexible film 11. For example, an Anisotropic Conductive Film (ACF) or a Non-Conductive Paste (NCP) may be used as the under fill 16.

Different from the example embodiment of FIG. 1, the heating pad 20 may be disposed on the semiconductor IC chip 18. To improve protection against heat, an adhesive layer 21 may be disposed between the heating pad 20 and the IC chip 18. The adhesive layer 21 may include conductive particles, for example, metal particles and/or metal balls, as shown in FIG. 1.

As discussed above, a flexible film having a plurality of semiconductor IC chips 18 may be wound and transported to an appropriate cutting apparatus. When the flexible film is wound and unwound repeatedly, stress may be concentrated against the heating pad 20 at "B" and "C" as illustrated in FIG. 2. The stress at "B" and "C" may cause the heating pad 20 to peel off the semiconductor IC chip 18 or to be torn at these positions.

Figure 6A:
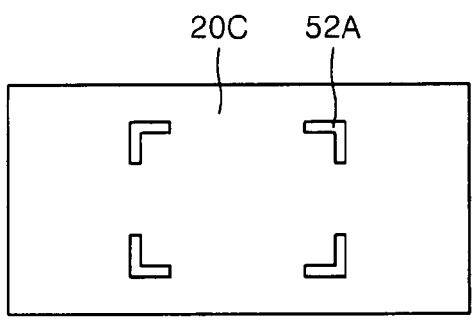
FIGS. 6A, 6B, 7A, 7B, 8A and 8B are schematic drawings of heating pads having slots according to example embodiments.
Figure 6B:
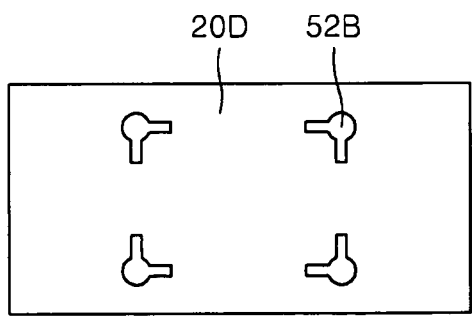

As illustrated in FIGS. 6A and 6B, to reduce the stress at "B", the heating pad 20C and 20D may include slots 52A and 52B, respectively. The slots 52A, 52B may be located on the heating pad 20C and 20D corresponding to corners of the semiconductor IC chip 18. The slots 52A, 52B may be indented notches in the heating pad 20C and 20D. The slots 52A, 52B may be of various shape and sizes. As illustrated in FIG. 6A, slots 52A may be in a shape of an "L." As illustrated in FIG. 6B, slots 52B may be in a shape of an "L" with a circle at a corner.

Figure 7A:
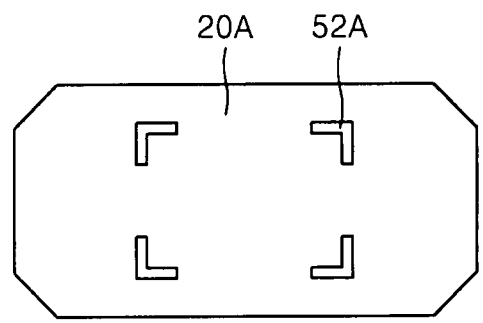
Figure 7B:
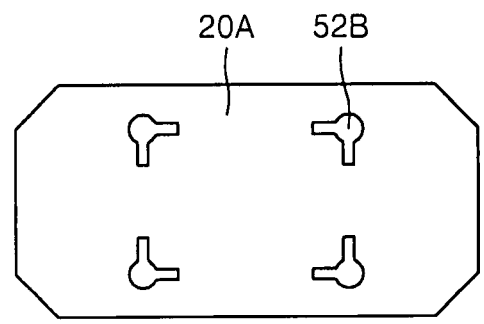
Figure 8A:
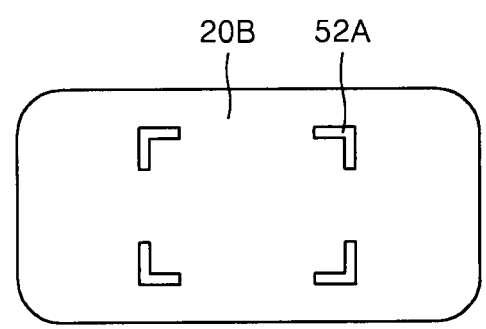
Figure 8B:
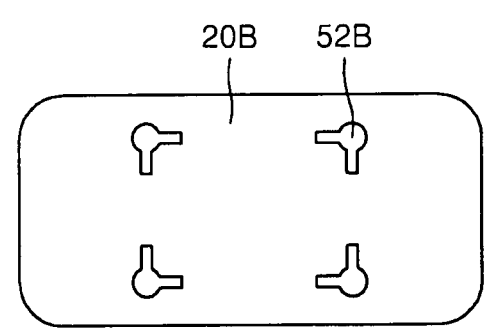

In other example embodiments illustrated in FIGS. 7A and 7B, the heating pad 20A with chamfered corners may have slots 52A, or the heating pad 20A with chambered corners may have slots 52B, respectively. In further example embodiments illustrated in FIGS. 8A and 8B, the heating pad 20B with rounded corners may have slots 52A, or the heating pad 20B with rounded corners may have slots 52B, respectively. Example embodiments such as those illustrated in FIGS. 7-8 may reduce stress on "B" and "C" as illustrated in FIG. 2. It will be appreciated to a person of ordinary skill that the heating pad and/or slots may include other shape and sizes contemplated within the scope of example embodiments.

Figure 9A:
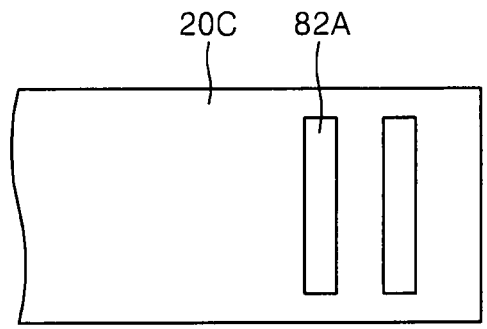
FIGS. 9A and 9B are schematic diagram of heating pads having slots according other example embodiments.
Figure 9B:
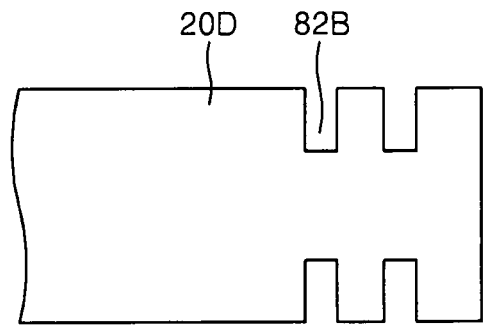
Figure 10:
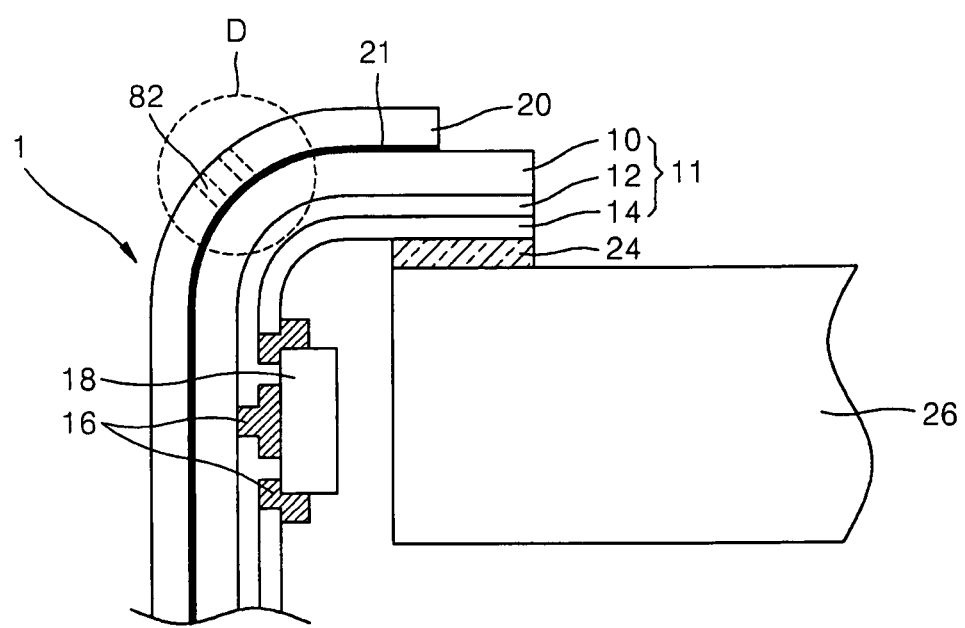
FIG. 10 is schematic diagram a COF type semiconductor package attached to a display panel board according to an example embodiment.

FIGS. 9-10 illustrate other example embodiments. Referring to FIG. 10, a COP type semiconductor package 1 may be connected to a display panel board 26. The display panel board 26 may be an LCD panel board.

As illustrated in FIG. 10, a COF type semiconductor package 1 may include a semiconductor IC chip 18 disposed on a flexible film 11. The flexible film 11 may include a lower insulation layer 10, a lead layer 12, and/or a surface insulation layer 14. For example, the lower insulation layer 10 may be of polyimide, the lead layer 12 may be of copper, and the surface insulation layer 14 may be a surface resist layer.

In areas between the semiconductor IC chip 18 and the flexible film 11, an under fill 16 may be provided to secure the semiconductor IC chip 18 and the flexible film 11.

A heating pad 20 may be attached to the lower insulation layer 10 of the flexible film 11 by an adhesive layer 21. The heating pad 20 may radiate heat generated from the semiconductor IC chip 18, after the heat passes through the under fill 16, the lead layer 12, and the lower insulation layer 10. To improve protection against heat, the adhesive layer 21 may be disposed between the heating pad 20 and the lower insulation layer 10. The adhesive layer 21 may include conductive materials, for example, metal particles and/or metal balls.

When the COF type semiconductor package 1 is attached to the display panel board 26 via an adhesive member 24, the heating pad 20 may be bent at "D". The bending of the heating pad 20 may cause stress at "D," which may cause the heating pad 20 to be detached from a lower insulation layer 10 of the flexible film 11, or to be detached from an adhesive layer 21.

To reduce the stress at "D," the heating pad 20 may include slots 82. Slots 82A may be disposed completely within the heating pad 20C as illustrated in FIG. 9A, or slots 82B may be notches disposed at edges (for example, opposite edges from each other) as illustrated in FIG. 9B. It may be appreciated to a person of ordinary skill that other shape, size and locations of the slots may be contemplated within the scope of example embodiments.

Figure 11:
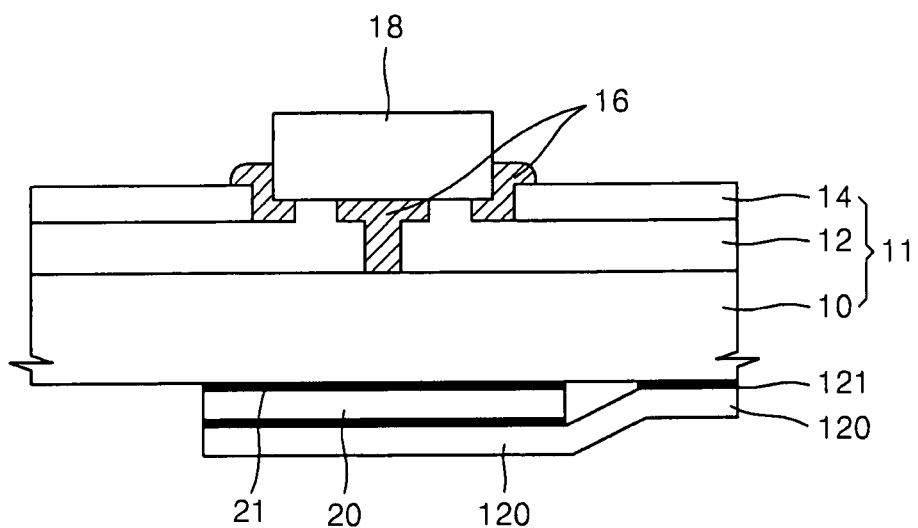
FIG. 11 is a cross sectional view of a COF type semiconductor package having a reinforcement member adhered to the heating pad of FIG. 1, according to an example embodiment.

FIG. 11 is a sectional view of COF type semiconductor package 1 according to other example embodiments. Compared to FIG. 1, a lower reinforcement member 120 may be attached on the lower heating pad 20 of FIG. 1 via an adhesive 121. A detailed description of the same elements as FIG. 1 may be omitted.

Referring to FIG. 11, the lower reinforcement member 120 may be formed on the lower heating pad 20 to improve the adhesiveness thereof using the adhesive 121. As shown in FIG. 11, a part of the lower reinforcement member 120 may cover the lower heating pad 20 and another part of the lower reinforcement member 120 may extend and adhere to the under surface of the flexible film 11. The width of the lower reinforcement member 120 may be larger than that of the lower heating pad 20 to sufficiently cover the lower heating pad 20 for improved adhesiveness.

The lower reinforcement member 120 may be made of a flexible film, for example, polyimide-based flexible film. The adhesive 121 used may be the same as the adhesive 21 disposed between the heating pad 20 and the flexible film 11. For instance, an acrylic-based adhesive material may be used as the adhesive 121. The adhesive 121 may include conductive particles of metal particles or metal ball of small size, for example, aluminum particles or balls therein.

In other example embodiments, the lower reinforcement member 120 may be made of opaque material or colored material capable of reducing reflection of light to improve the degree of image recognition in an Outer Lead Bonding (OLB) process.

Figure 12:
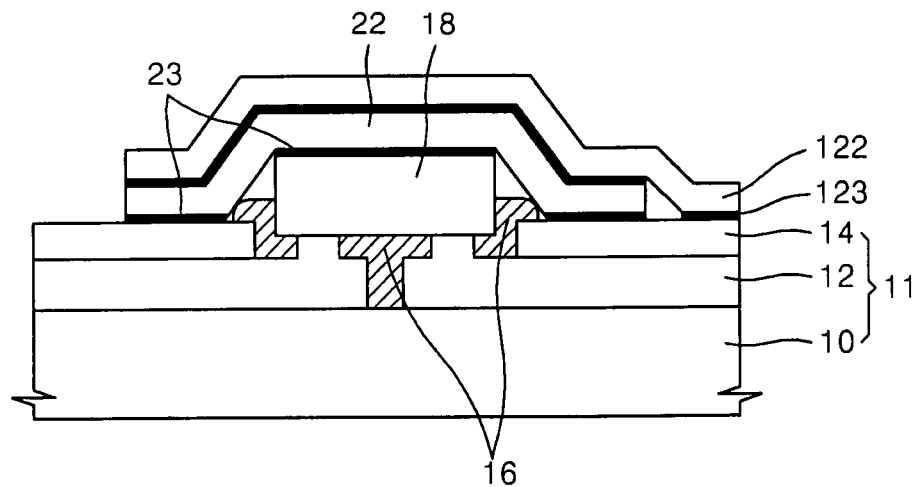
FIG. 12 is a cross sectional view of a COF type semiconductor package having a reinforcement member adhered to the heating pad of FIG. 2, according to an example embodiment.

FIG. 12 is a sectional view of COF type semiconductor package 1 according to other example embodiments. Compared to FIG. 2, an upper reinforcement member 122 may be attached on the upper heating pad 22 via an adhesive 121, similar to FIG. 2. The detailed description of the same elements as FIG. 2 may be omitted.

Referring to FIG. 12, the upper reinforcement member 122 may be formed on the upper heating pad 22 to improve the adhesiveness thereof using the adhesive 121. As shown in FIG. 12, a part of the upper reinforcement member 122 may cover the upper heating pad 22 and another part of the reinforcement member 122 may extend and adhere to the upper surface of the flexible film 11, namely, to the surface of the surface insulation layer 14. The width of the reinforcement member 122 may be larger than that of the upper heating pad 22 to sufficiently cover the upper heating pad 22 for improved adhesiveness.

The upper reinforcement member 122 may be made of a flexible film, for example, polyimide-based flexible film. The adhesive 121 may be used as same as the adhesive 21 disposed between the heating pad 22 and the flexible film 11. For instance, an acrylic-based adhesive material may be used as the adhesive 121. The adhesive 121 may include conductive particles of metal particles or metal ball of small size, for example, aluminum particles or balls therein.

The upper reinforcement member 122 may be made of opaque material or colored material capable of reducing reflection of light to improve the degree of image recognition in an Outer Lead Bonding (OLB) process.

The foregoing may be illustrative of example embodiments and may not to be construed as limiting thereof. Although example embodiments have been described, those skilled in the art will readily appreciate that many modifications may be possible without materially departing from the novel teachings and aspects of example embodiments. For example, the heating pad 20 may be formed under the flexible film 11 and over the flexible film 11 simultaneously, and the reinforcement member 120 and 122 may also be formed under the flexible film 11 and over the flexible film 11 simultaneously. Accordingly, all such modifications are intended to be included within the scope of appended claims.

What is claimed is:

1. A flexible semiconductor package comprising:
   a stack comprising:
      a flexible film substrate;
      a semiconductor chip on the flexible substrate;

a metal pad layer positioned to dissipate heat generated from the semiconductor chip; and
an insulating flexible reinforcement film attached to a major surface of the metal pad layer,
wherein the flexible reinforcement film has an outer position in the stack with respect to the flexible film substrate, the semiconductor chip and the metal pad layer.

2. The flexible semiconductor package of claim 1, wherein a width of the flexible reinforcement film is larger than a width of the metal pad layer.

3. The flexible semiconductor package of claim 2, wherein a part of the flexible reinforcement film is attached to the metal pad layer, and another part of the flexible reinforcement film extends past a boundary of the metal pad layer and is attached to the flexible film substrate with an adhesive.

4. The flexible semiconductor package of claim 3, wherein the flexible reinforcement film comprises a polyimide flexible film.

5. The flexible semiconductor package of claim 3, wherein the flexible reinforcement film consists of a polyimide flexible film.

6. The flexible semiconductor package of claim 3, wherein the flexible reinforcement film comprises opaque means for reducing light reflection.

7. The flexible semiconductor package of claim 3, wherein the flexible reinforcement film comprises colored means for reducing light reflection.

8. The flexible semiconductor package of claim 3, wherein the stack has the following order: the flexible reinforcement film, the metal pad layer, the flexible film substrate and the semiconductor chip.

9. The flexible semiconductor package of claim 8, wherein an edge of the flexible reinforcement film is vertically aligned with an edge of the metal pad layer.

10. The flexible semiconductor package of claim 9, wherein the width of the metal pad layer is larger than a width of the semiconductor chip.

11. The flexible semiconductor package of claim 10, wherein the metal pad layer extends past opposite sides of the semiconductor chip.

12. The flexible semiconductor package of claim 3, further comprising a first adhesive layer including metal particles disposed between the metal pad layer and the flexible reinforcement film.

13. The flexible semiconductor package of claim 12, further comprising a second adhesive layer including metal particles disposed between the flexible film substrate and the metal pad layer.

14. The flexible semiconductor package of claim 3, wherein a shape of the metal pad layer is substantially a rectangle with at least one rounded corner.

15. The flexible semiconductor package of claim 1, wherein the stack has the following order: the flexible film substrate, the semiconductor chip, the metal pad layer and the flexible reinforcement film.

16. The flexible semiconductor package of claim 15, wherein the metal pad layer extends across and past opposite edges of the semiconductor chip and includes portions attached with adhesive to the flexible film substrate at locations outside the opposite edges of the semiconductor chip.

17. The flexible semiconductor package of claim 15, wherein the metal pad layer includes slots.

18. The flexible semiconductor package of claim 17, wherein the slots are disposed at corner edges of the semiconductor chip.

19. The flexible semiconductor package of claim 18, wherein the slots have an "L" shape.

20. A Chip on Flexible Printed Circuit (COF) type semiconductor package comprising:
an insulating flexible film substrate including an upper surface and a lower surface;
a semiconductor chip on the upper surface of the flexible film substrate;
a metal pad attached to the lower surface of the flexible film substrate at a location underneath the semiconductor chip to dissipate heat generated from the semiconductor chip;
a first adhesive layer on the lower surface of the flexible film substrate attaching the metal pad to the lower surface of the flexible film substrate; and
a reinforcement layer on the lower surface of the flexible film substrate,
wherein the metal pad is interposed between the reinforcement layer and the flexible film substrate.

21. The COF type semiconductor package of claim 20, wherein the reinforcement layer is an insulating flexible film.

22. The COF type semiconductor package of claim 20, wherein the metal pad is fully covered by the reinforcement layer.

23. The COF type semiconductor package of claim 20, wherein the reinforcement layer extends along an entire width of the metal pad.

24. The COF type semiconductor package of claim 20, wherein a shape of the metal pad layer is substantially a rectangle with at least one rounded corner.

25. The COF type semiconductor package of claim 20, wherein a shape of the metal pad layer is substantially a rectangle with at least one chamfered corner.

26. The COF type semiconductor package of claim 20, wherein the first adhesive layer comprises metal particles.

27. The COF type semiconductor package of claim 26, further comprising a second adhesive layer interposed between the metal pad and the reinforcement layer.

28. The COF type semiconductor package of claim 26, wherein a space is formed between the flexible film substrate and the reinforcement layer.

29. The COF type semiconductor package of claim 26, wherein the metal pad comprises aluminum.

30. The COF type semiconductor package of claim 29, wherein the reinforcement layer comprises a polyimide flexible film.

31. A display device comprising:
an insulating flexible film substrate including an upper surface and a lower surface;
a semiconductor chip on the upper surface of the flexible film substrate;
a metal pad attached to the lower surface of the flexible film substrate at a location underneath the semiconductor chip to dissipate heat generated from the semiconductor chip;
a first adhesive layer on the lower surface of the flexible film substrate attaching the metal pad to the lower surface of the flexible film substrate;
a reinforcement layer on the lower surface of the flexible film substrate, wherein the metal pad is interposed between the reinforcement layer and the flexible film substrate; and
a display panel board wherein the flexible film substrate is connected to the display panel board.

32. A flexible semiconductor package comprising:
a flexible film;
a semiconductor chip on an upper surface of the flexible film;

a composite layer comprising a metal layer to dissipate heat generated from the semiconductor chip, a reinforcement layer and an adhesive attaching the metal layer and the reinforcement layer, wherein the composite layer is disposed on the lower surface of the flexible film, wherein the metal layer is disposed between the flexible film and the reinforcement layer, wherein at a side of the composite layer, edges of the metal layer and the reinforcement layer are aligned.

33. The flexible semiconductor package of claim 32, wherein the composite layer consists essentially of the metal layer, the reinforcement layer and the adhesive attaching the metal layer and the reinforcement layer.

34. The flexible semiconductor package of claim 32, wherein the reinforcement layer comprises a first part of the reinforcement layer extending along an entire width of the metal layer, a second part extending from the first part of the reinforcement layer and not attached to the metal layer, and a third part extending from the second part and adhering to the flexible film.

* * * * *